United States Patent [19]
Hasegawa et al.

[11] Patent Number: 5,828,572
[45] Date of Patent: *Oct. 27, 1998

[54] PROCESSING SYSTEM AND SEMICONDUCTOR DEVICE PRODUCTION METHOD USING THE SAME INCLUDING AIR CONDITIONING CONTROL IN OPERATIONAL ZONES

[75] Inventors: Takayuki Hasegawa; Hidehiko Fujioka, both of Utsunomiya; Yoshito Yoneyama, Kawasaki, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 677,358

[22] Filed: Jul. 5, 1996

[30] Foreign Application Priority Data

Jul. 7, 1995 [JP] Japan .................................. 7-172066

[51] Int. Cl.$^6$ .................................................. B65G 65/30
[52] U.S. Cl. .............................. 364/468.24; 364/478.16; 364/478.17; 364/152; 364/140.03; 454/187; 454/188; 55/385.2
[58] Field of Search ........................ 364/478.16, 478.17, 364/468.24, 471.03, 152, 156, 140.02, 140.03; 414/147; 62/1; 55/385.1, 385.2, 472, 385, 97, 467; 98/31.5, 34.6, 36, 31.6; 454/187, 188, 233, 236, 251, 228

[56] References Cited

U.S. PATENT DOCUMENTS

| | | |
|---|---|---|
| 4,549,472 | 10/1985 | Endo et al. .............................. 98/34.6 |
| 4,604,027 | 8/1986 | Becker et al. ........................... 414/749 |
| 4,699,640 | 10/1987 | Suzuki et al. ............................. 55/385 |
| 4,701,096 | 10/1987 | Fisher, Jr. ................................ 414/416 |
| 4,838,150 | 6/1989 | Suzuki et al. ............................. 98/31.5 |
| 5,026,239 | 6/1991 | Chiba et al. .............................. 414/217 |
| 5,096,477 | 3/1992 | Shinoda et al. ............................ 55/385 |
| 5,134,436 | 7/1992 | Fujioka ...................................... 355/30 |
| 5,208,124 | 5/1993 | Sporon-Fielder et al. ......... 364/468.24 |
| 5,232,401 | 8/1993 | Fujita et al. ............................. 454/187 |
| 5,317,615 | 5/1994 | Ebinuma et al. ......................... 378/34 |
| 5,331,825 | 7/1994 | Kim ......................................... 62/180 |
| 5,341,651 | 8/1994 | Inoue ....................................... 62/225 |
| 5,353,231 | 10/1994 | Sasaki et al. ........................... 364/473 |
| 5,384,709 | 1/1995 | Seder et al. ........................ 364/468.24 |
| 5,450,346 | 9/1995 | Krummen et al. ................ 364/468.24 |
| 5,467,637 | 11/1995 | Hasegawa et al. ..................... 73/24.01 |

FOREIGN PATENT DOCUMENTS

0322205 6/1989 European Pat. Off. .

*Primary Examiner*—Reba I. Elmore
*Assistant Examiner*—Ramesh Patel
*Attorney, Agent, or Firm*—Fitzpatrick, Cella, Harper & Scinto

[57] ABSTRACT

A processing system for processing semiconductor devices includes an adjusting device for adjusting atmospheric conditions such as the cleanness and temperature in a clean room, at least one processing device disposed in the clean room, and a control device for controlling operation of the adjusting device in accordance with an operating state of at least one of the processing devices. The invention makes it possible to highly control the air conditioning of a required location and at a required time.

28 Claims, 5 Drawing Sheets

PROCESSING SYSTEM AND SEMICONDUCTOR DEVICE PRODUCTION METHOD USING THE SAME INCLUDING AIR CONDITIONING CONTROL IN OPERATIONAL ZONES

BACKGROUND OF THE INVENTION

1. Field of the Invention

The present invention relates to a processing system for producing very small devices, such as semiconductors, in a production plant.

2. Description of the Related Art

The production of increasingly integrated semiconductor devices has caused an increasing demand for more advanced photolithography micromachining techniques in production plants. To respond to such a demand, an effort has been made to improve air conditioning control in the production plant to increased levels so that the cleanness of the air can be set to a high level and the temperature can be set within a predetermined range. Accordingly, the yield of a production line in the semiconductor production plant is increased by maintaining the air conditioning at a high level so that the cleanness and the temperature in the clean room are maintained at predetermined levels.

However, to maintain such levels, the production facility and facility running costs increase considerably as the semiconductors become more integrated. Therefore, keeping the overall production costs as low as possible is a significant consideration in order to keep the overall investments economical.

In the above-described conventional example, air conditioning control is performed at a high level in the entire (for every portion of) clean room in order to maintain the cleanness and temperature of the air within predetermined ranges. This means that air conditioning control is also performed at areas within the clean room where air need not be conditioned or controlled to such an extent. In addition, the cleanness and temperature of the air are constantly kept at predetermined levels even when it is not necessary. Therefore, a large air-conditioning device that constantly consumes a large amount of power is required. This results in higher facility and running costs.

SUMMARY OF THE INVENTION

In view of the above-described problems, an object of the present invention is to reduce facility and running costs primarily from air-conditioning considerations.

To this end, the present invention, in a first aspect, provides a processing system that includes adjusting means for adjusting atmospheric conditions in a clean room; at least one processing device disposed in the clean room; and control means for controlling operation of the adjusting means in accordance with an operating state of at least one of the processing devices. By virtue of such a construction, it is possible to control the air conditioning level in a particular location in the clean room to an appropriate level and at an appropriate time. As a result of this, it is possible to reduce facility costs and facility running costs in the entire plant.

The present invention, in another aspect, provides a processing system for processing semiconductor devices. The processing system includes a plurality of processing devices, disposed in a clean room, for processing the semiconductor devices, a plurality of adjusting means, each associated with a corresponding one of the plurality of processing devices, for adjusting atmospheric conditions of a respective processing device and control means for individually controlling operation states of the plurality of adjusting means based on an operating state of a respective processing device.

The present invention, in yet another aspect, provides a device production method for producing semiconductor devices. The method includes providing a processing system in the manner discussed above in the preceding paragraph, and processing semiconductor devices in the plurality of processing devices.

DESCRIPTION OF THE PREFERRED EMBODIMENTS

A semiconductor device production line processing system, as an embodiment of the present invention, will now be described.

Figure 1:
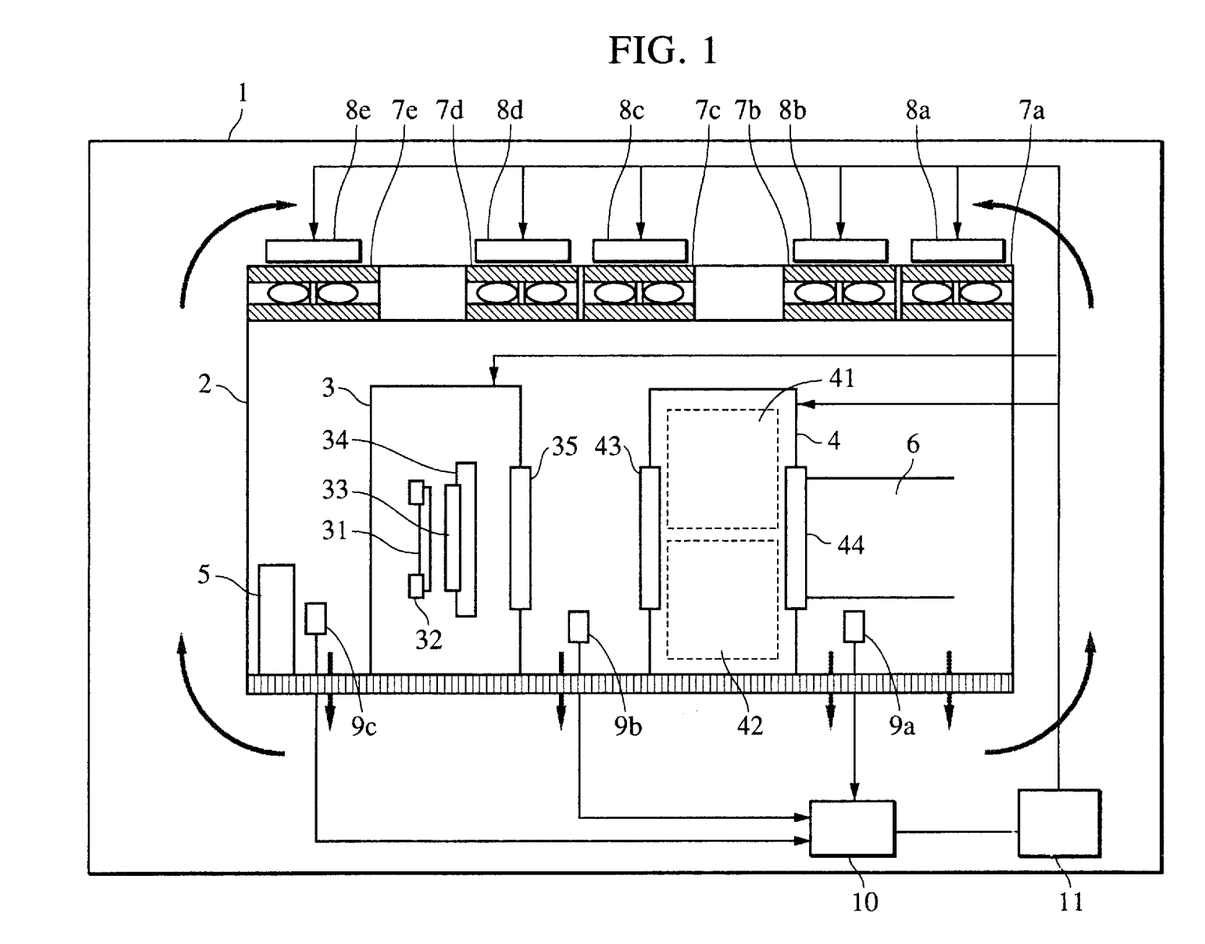
FIG. 1 is a structural view of an embodiment of a processing system in accordance with the present invention.

Referring to FIG. 1, reference numeral 1 denotes a production plant that includes a clean room 2. A first processing chamber 3 and a second processing chamber 4 are disposed on the floor of the clean room 2. The first processing chamber 3, being an air-tight exposure chamber, contains a mask stage 32 for holding a mask 31 and a wafer positioning stage 34 for holding a wafer 33. In the chamber 3, a mask pattern is exposed onto the wafer 33 by means of light from a light source (not shown) in order to transfer the pattern thereon. The light source emits light having a wavelength sufficient for this pattern transfer. For example, X-rays, a laser beam or ultraviolet rays may be used. The chamber 3 also has a door 35 through which the wafer 33 can enter and leave the chamber 3. The second processing chamber 4 also is air-tight and includes a coater/developer device, in which a coater 41 and a developer 42 are provided in one chamber. The coater 41 is used for coating a resist onto the wafer 33, while the developer 42 is used for subjecting the wafer 33 to development after exposure. The chamber 4 also has doors 43 and 44 through which the wafer 33 can enter and leave the chamber 4. An automated guided vehicle (AGV) path 6 connected to the second processing chamber 4 by means of the door 44 is provided to allow transfer of the wafer between the second processing chamber 4 and another processing device. Reference numeral 5 denotes a mask storage device for storing a plurality of masks, which are required when superimposing and printing a mask pattern onto the wafer 33 by exposure. These masks can be conveyed between the mask storage device 5 and the mask stage 32 in the first processing chamber 3 by means of a conveying mechanism (not shown).

Reference numerals 7a to 7e each denote fan filter units (FFU) each comprising a filter and a rotating fan formed into an integral structure and arranged in a line along the ceiling of the clean room 2. The rotating speed (blowing capacity) of each fan is independently controllable. The filter is used to filter out foreign particles in the air. It is to be noted that the filter and the fan do not necessarily have to be formed into one unit. Reference numerals 8a to 8e each denote cooling coils. A cooling coil is provided for each FFU so that the temperature of the air from an FFU can be independently adjusted. Reference numerals 9a to 9c each denote measuring devices. These measuring devices may comprise a particle detector and a temperature sensor, forming a set. The particle detectors measure the degree of cleanness at respective locations in the clean room, while the temperature sensors measure the air temperature. Reference numeral 10 denotes a controller for controlling the measuring devices. The particle detector measures the cleanness by counting the number of foreign particles, such as dust particles, in the air. Reference numeral 11 denotes a main controller for controlling the entire air conditioning system in the plant 1 by monitoring the operating state of the exposure chamber 3 and the number of foreign particles counted by the particle detectors 9a to 9c, as well as controlling the blowing capacity of each of the FFUs 7a to 7e, the cooling capacity of each of the cooling coils 8a to 8e, and the operating sequence of each of the processing devices.

As shown by the arrows in FIG. 1, air cleaned and temperature-controlled by the FFUs 7a to 7e is blown into the clean room 2, discharged from the floor of the clean room, and circulated through a path outside the clean room and back to the FFUs 7a to 7e. The present invention provides for individual control of the operating capacity of each FFU and cooling coil. This makes it possible to change the amount of air supply and the temperature of the supply air of only those areas near an FFU and a cooling coil whose capacities need to be controlled. Thereby, adjustments in the cleanness and the temperature of the conditioning air at a desired location in the clean room can be achieved.

Figure 2:
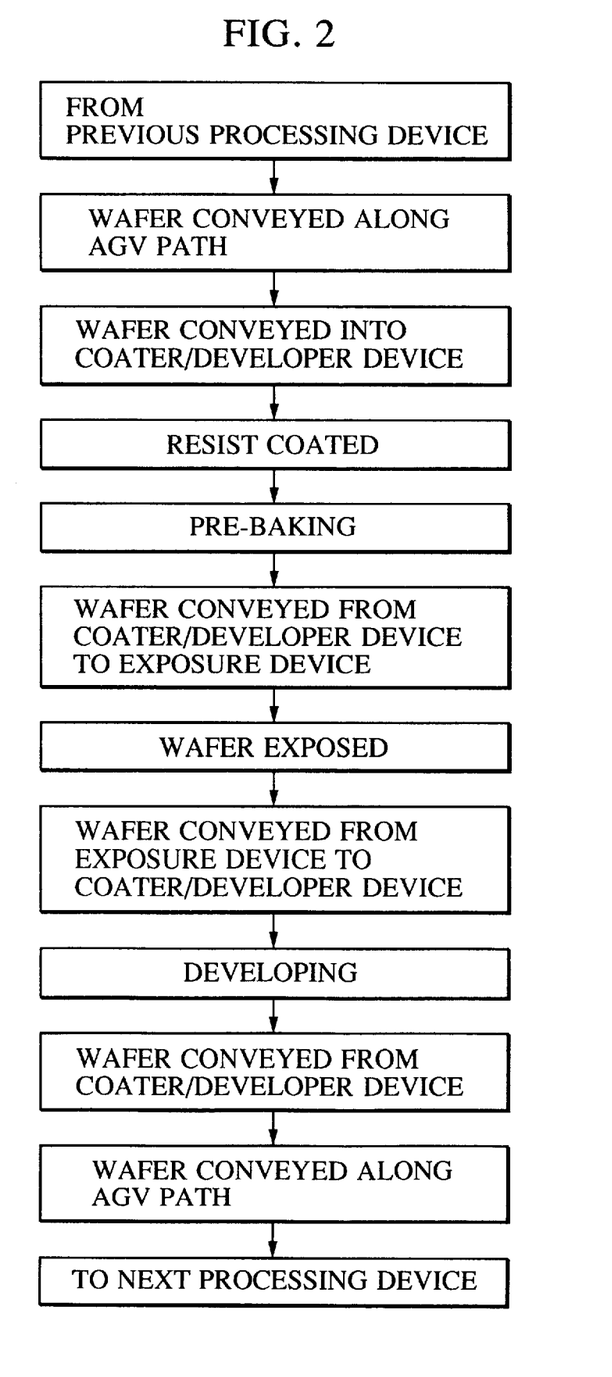
FIG. 2 is a flowchart showing the wafer processing steps in the processing system of FIG. 1.

As shown in the flowchart of FIG. 2, after a preliminary wafer process, such as an exposure step in the first processing chamber 3, for example, the wafer is conveyed into the coater 41 in the second processing chamber 4 via the AGV path 6 or a wafer conveyor. The wafer in the coater is coated with a resist and subjected to pre-baking, after which the coated wafer is conveyed to the exposure device in the first processing chamber 3 by means of a wafer conveying mechanism (not shown) in order to be exposed thereby. After being exposed, the wafer is conveyed from the first processing chamber 3 to the developer 42 in the second processing chamber 4 where it is subjected to development. After being subjected to development, the wafer is conveyed to the AGV path 6 to prepare it for the next processing.

Figure 3:
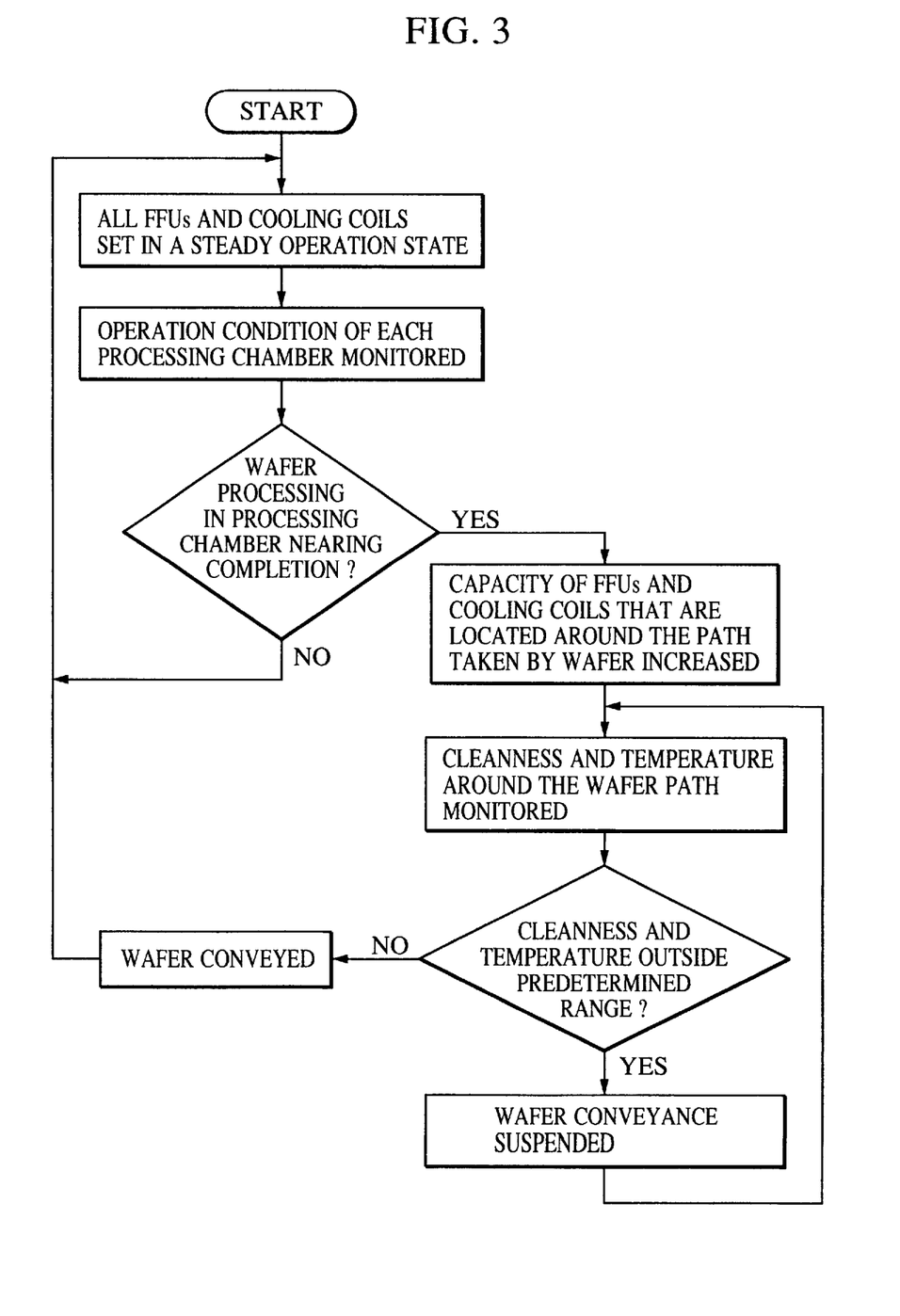
FIG. 3 is a flowchart showing the air conditioning control steps in the processing system of FIG. 1.

FIG. 3 is a detailed flowchart showing an air-conditioning control procedure. When the wafer is being conveyed along the AGV path or between the processing chambers, the wafer (or the wafer carrier) is in direct contact with the air in the clean room. This makes it necessary to carry out air conditioning control at a high level in order to realize a high level of cleanness whereby the wafer is kept free from foreign particles and to control the temperature within a predetermined range. To achieve these ends, the main controller 11 monitors the processing parameters of each processing chamber and increases the running capacity (or the number of fan rotations) of only the FFUs located near the path taken by the wafer being conveyed in the clean room, whereby a high level of cleanness is maintained only in that particular location of the clean room. At the same time, the main controller 11 controls the cooling capacity of the cooling coils so that the temperature measured by the measuring device falls within a prescribed temperature control range. More specifically, when the wafer is being conveyed along the AGV path, the fan rotating speeds of FFU 7a and FFU 7b are increased, and the cooling capacities of the cooling coils 8a and 8b are adjusted. On the other hand, when the wafer is being conveyed between the first processing chamber 3 and the second processing chamber 4, the fan rotating speeds of FFU 7c and FFU 7d are increased, and the cooling capacities of the cooling coils 8c and 8d are adjusted. It takes a little while for the level of cleanness to reach a high level after the fan rotating speeds of the FFUs have been increased. Similarly, it takes a little while for the air temperature to actually fall within the predetermined range after the cooling capacities of the cooling coils have been changed. Therefore, the fan rotating speeds of the FFUs and the cooling capacities of the cooling coils are actually increased and adjusted, respectively, a predetermined period of time prior to the wafer being conveyed. The time delay in achieving a high level of cleanness and the time delay in obtaining the required temperature are measured before placing the system in operation.

The main controller 11 determines that an abnormality has occurred when the count value of either the measuring device 9a or 9b located near the portion of the path taken by the aforementioned wafer being conveyed shows that the level of cleanness has fallen below a predetermined value (that is, there are more foreign particles per air unit amount than a prescribed amount) and/or the air temperature is outside a predetermined range. Therefore, the conveying of the wafer is suspended until the count value of the detector falls within the predetermined range. When the conveying of the wafer is completed and the wafer is securely contained in the air-tight processing chamber, it is no longer necessary to carry out air filtering and temperature control at a high level, so that the fan rotating speeds of the FFUs and the cooling capacities of the cooling coils are reduced to reduce the amount of power consumption.

In the foregoing description, the level of cleanness and the temperature of the paths in the clean chamber have been adjusted in the path along which the wafer is to be conveyed. Such adjustments can similarly be made when a mask is to be conveyed. More specifically, when a mask is conveyed between the mask storage device 5 and the first processing chamber 3 in order to be replaced, the mask or the mask carrier is exposed to the air in the clean room, so that the fan rotating speed of FFU 7e and the cooling capacity of cooling coil 8e are controlled, while the number of foreign particles counted by counting device 5c is being monitored, in order to perform air conditioning and temperature control along the path taken by the mask being conveyed.

Although in the foregoing embodiment, an exposure device and the coater/developer were used in the first processing chamber 3 and the second processing chamber 4, respectively, other devices may also be used therein and are equally applicable to the present embodiment. Examples thereof include a heat treating device, a sputtering device, a chemical-vapor deposition (CVD) device, an epitaxial device, a dispersing device, an annealing device, and an inspection device. More specifically, the first processing chamber and the second processing chamber each may include a combination of any of the following devices: an exposure device, a coater device, a developer device, a heat treating device, a sputtering device, a CVD device, an epitaxial device, a dispersing device, an annealing device, and an inspection device.

According to the present embodiment, it is possible to perform and concentrate high-level air-conditioning control at a particular required location and at a required time by adjusting the conditions of the air at a particular location of the clean room in accordance with the operating state of each processing device that has been monitored. Accordingly, compared to a case in which a large air-conditioning facility is used to perform high-level air-conditioning control for an entire clean room so as to keep the level of cleanness and temperature within their respective predetermined ranges, facility costs and power consumption (running costs) and thus, device production costs are reduced in the present invention.

A description will now be given of an embodiment of a device production method including the processing steps in the above-described processing system.

Figure 4:
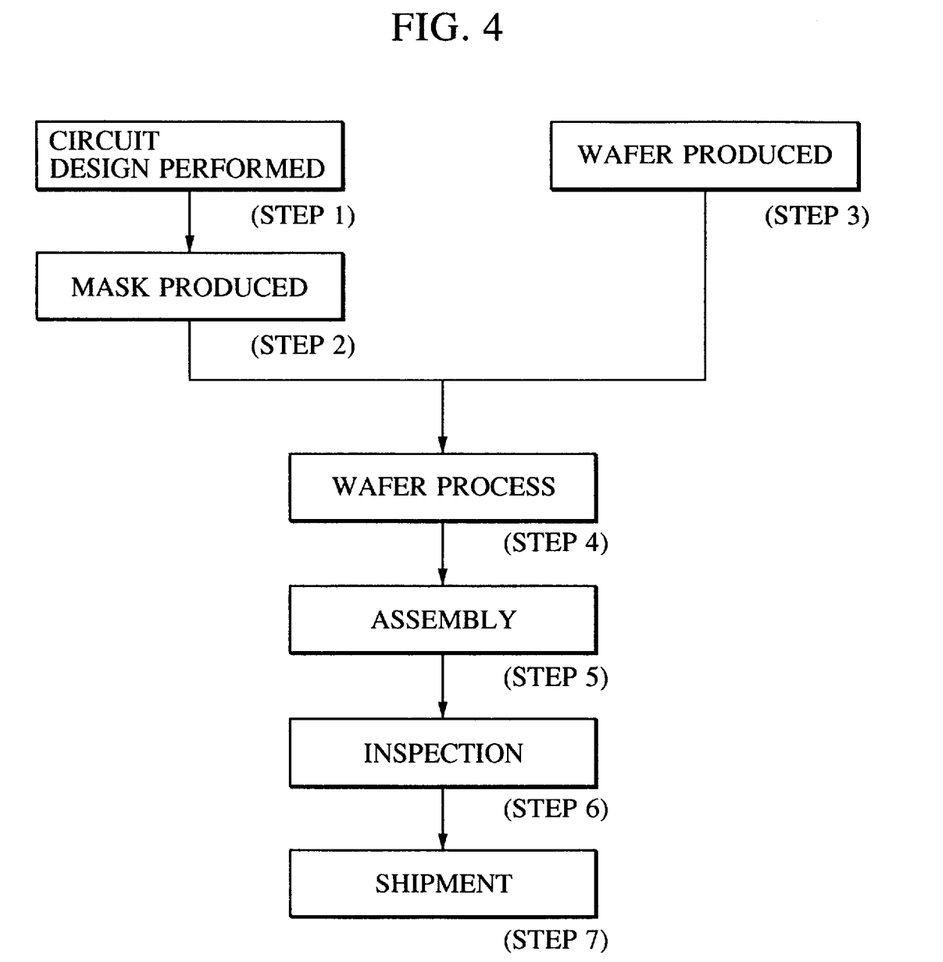
FIG. 4 is an overall flowchart showing semiconductor device production steps.

FIG. 4 is a flowchart showing production method steps of a tiny device such as a semiconductor chip including an IC and LCI, a liquid crystal panel, a charge-coupled device (CCD), a thin-film magnetic head, a micromachine, or the like. In Step 1, the circuit of the semiconductor device is designed. Then, in Step 2, a mask circuit pattern is produced. In Step 3, a wafer is produced using silicon or other such material. In Step 4 (wafer process), the prepared mask circuit pattern and wafer are used in order to actually form the designed circuit onto the wafer using lithography techniques. Then, in the following Step 5, the wafer with the circuit formed thereon is formed into a semiconductor chip, wherein assembly (dicing, bonding), packaging (of the chip), and the like are performed. In Step 6, the semiconductor device prepared in Step 5 is inspected by conducting operation confirmation and durability tests. Thereafter, in Step 7, the semiconductor device is shipped.

Figure 5:
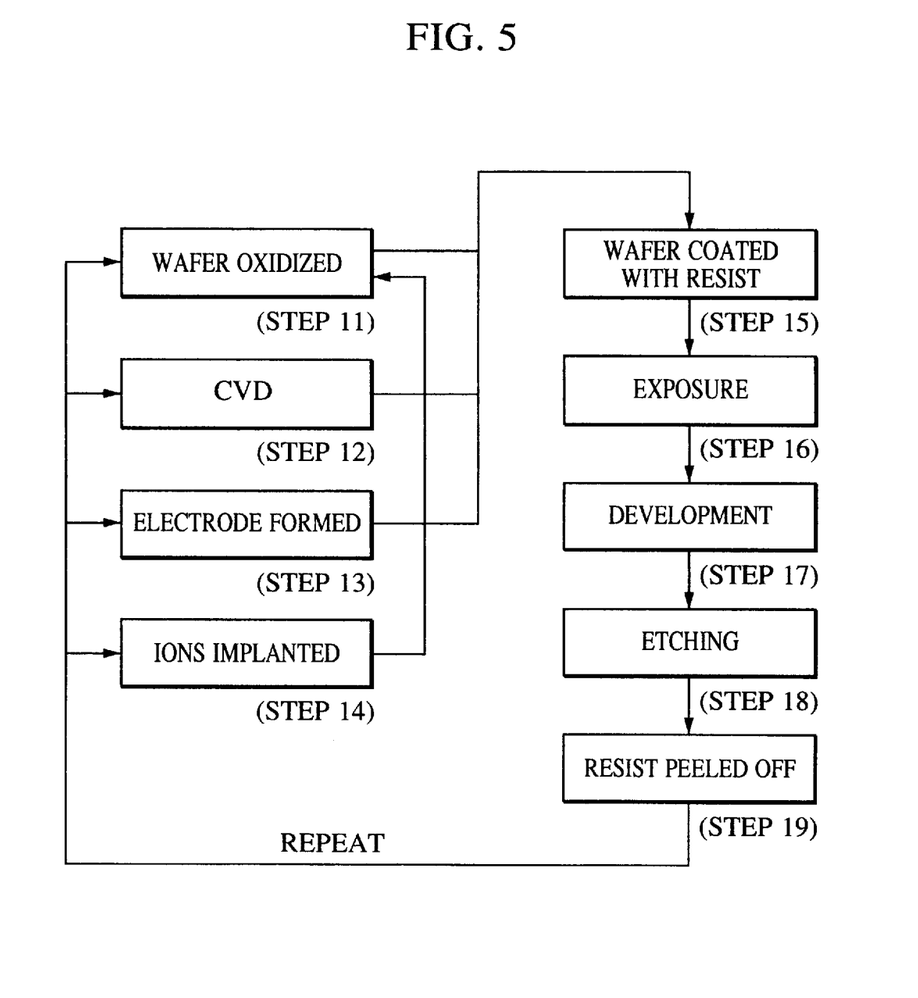
FIG. 5 is a detailed flowchart showing a process for manufacturing semiconductor wafers.

FIG. 5 is a detailed flowchart showing the above-described wafer process in more detail. In Step 11, the surface of the wafer is oxidized. Then, in Step 12 (chemical-vapor deposition (CVD) step), an insulation film is formed on the wafer surface. In Step 13, an electrode is formed on the wafer by evaporation. In Step 14, ions are implanted into the wafer. In Step 15, the above-described coater is used to coat a photosensitization agent onto the wafer. In Step 16, the mask circuit pattern is printed onto the wafer by exposure using the aforementioned exposure device. In Step 17, the above-described developer is used to develop the exposed portion of the wafer. In Step 18, portions other than the developed resist image are etched. In Step 19, the unnecessary resist is removed from the wafer after etching. Multiple circuit patterns are formed on the wafer by repeating the above-described steps.

According to the production method in the present embodiment, it is possible to produce a highly-integrated semiconductor device at a low cost.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A processing system comprising:
    a plurality of processing devices disposed in a clean room for processing a device being moved along a conveyance path in the clean room;
    a plurality of measuring devices for measuring atmospheric conditions at a plurality of locations within the clean room, along the conveyance path of the device being processed by said plurality of processing devices, and for producing corresponding outputs;
    adjusting means for adjusting at least one partial atmospheric condition at each of the plurality of locations along the conveyance path within the clean room; and
    control means for receiving (i) the outputs of said plurality of measuring devices and (ii) information related to an operating state of at least one of said processing devices, and for controlling operation of said adjusting means to vary the partial atmospheric condition while at least one of said processing devices is in operation at each of the plurality of locations.

2. A processing system according to claim 1, wherein said adjusting means comprises air-conditioning means for adjusting the cleanness at at least one of the plurality of locations along the conveyance path in the clean room.

3. A processing system according to claim 2, further comprising a plurality of said air-conditioning means, each of which comprises independently controllable blowing means disposed adjacent to a wall of the clean room.

4. A processing system according to claim 3, wherein said plurality of measuring devices measure the cleanness of the air at the plurality of locations, and wherein said control means controls said blowing means based on the measurements made by said measuring devices.

5. A processing system according to claim 1, wherein said adjusting means comprises air-conditioning means for adjusting the temperature at at least one of the plurality of locations along the conveyance path in the clean room.

6. A processing system according to claim 5, further comprising a plurality of said air-conditioning means, each of which comprises independently controllable cooling means disposed adjacent to a wall of the clean room.

7. A processing system according to claim 5, wherein said plurality of measuring devices measure the temperature at the plurality of locations, and wherein said control means controls said cooling means based on the measurements made by said measuring devices.

8. A processing system according to claim 1, further comprising at least one chamber in the clean room in which a respective processing device is disposed, and wherein said control means controls the ambient atmosphere of the chamber independently of the atmosphere in the clean room.

9. A processing system according to claim 8, wherein a plurality of the chambers are provided in the clean room, and each of the chambers contains a respective processing device.

10. A processing system according to claim 1, wherein said plurality of processing devices comprise at least one of the following: an exposure device, a coater device, a developer device, a heat treating device, a sputtering device, a chemical-vapor deposition device, an epitaxial device, a diffusing device, an annealing device, and an inspection device.

11. A processing system according to claim 1, further comprising means for conveying a substrate from one processing device to another along the conveyance path, and wherein said control means causes said adjusting means to incrementally adjust the atmospheric conditions along the conveyance path of the substrate.

12. A processing system for processing semiconductor devices, said processing system comprising:
   a plurality of processing devices, each disposed in a clean room, for processing semiconductor devices being moved along a conveyance path in the clean room;
   a plurality of measuring devices for measuring atmospheric conditions at a plurality of locations within the clean room, along the conveyance path of the semiconductor devices being processed by said plurality of processing devices, and for producing corresponding outputs;
   a plurality of adjusting means, each associated with a corresponding one of said plurality of processing devices, for adjusting partial atmospheric conditions of a respective processing device at each of the plurality of locations along the conveyance path within the clean room; and
   control means for receiving (i) the outputs of said plurality of measuring devices and (ii) information related to an operating state of at least one of said processing devices, and for individually controlling operation states of said plurality of adjusting means to vary the partial atmospheric conditions while at least one of said processing devices is in operation at each of the plurality of locations.

13. A processing system according to claim 12, wherein said plurality of adjusting means each comprises air-conditioning means for adjusting the cleanness at at least one of the plurality of locations along the conveyance path in the clean room.

14. A processing system according to claim 13, wherein each of said air-conditioning means comprises independently controllable blowing means disposed adjacent to a wall of the clean room.

15. A processing system according to claim 14, wherein said plurality of measuring devices measure the cleanness of the air at the plurality of locations, and wherein said control means controls said blowing means based on the measurements made by said measuring devices.

16. A processing system according to claim 12, wherein said plurality of adjusting means each comprises air-conditioning means for adjusting the temperature at at least one of the plurality of locations along the conveyance path in the clean room.

17. A processing system according to claim 16, wherein each of said air-conditioning means comprises independently controllable cooling means disposed adjacent to a wall of the clean room.

18. A processing system according to claim 16, wherein a plurality of chambers are provided in the clean room, said plurality of measuring devices measure the temperature at the plurality of locations, and said control means controls the ambient atmosphere of each of the chambers independently of the atmosphere in the clean room.

19. A processing system according to claim 12, wherein a plurality of chambers are provided in the clean room, in each of which a respective processing device is disposed, and wherein said control means controls the ambient atmosphere of each of the chambers independently of the atmosphere in the clean room.

20. A processing system according to claim 12, wherein each of said processing devices comprises at least one of the following: an exposure device, a coater device, a developer device, a heat treating device, a sputtering device, a chemical-vapor deposition device, an epitaxial device, a diffusing device, an annealing device, and an inspection device.

21. A processing system according to claim 12, further comprising means for conveying a substrate from one processing device to another, along the conveyance path, and wherein said control means causes said adjusting means to incrementally adjust the atmospheric conditions of a respective processing device at each of the plurality of locations along the conveyance path of the substrate.

22. A device production method for producing semiconductor devices, said method comprising the steps of:
   providing a plurality of processing devices disposed in a clean room;
   processing, using the plurality of processing devices, a semiconductor substrate being moved along a conveyance path in the clean room;
   measuring, using a plurality of measuring devices, atmospheric conditions at a plurality of locations within the clean room, along the conveyance path of the substrate being processed by the plurality of processing devices, and producing corresponding output from the plurality of measuring devices;
   adjusting at least one partial atmospheric condition at each of the plurality of locations along the conveyance path within the clean room;
   receiving (i) the outputs of the plurality of measuring devices and (ii) information related to an operating state of at least one of the processing devices; and
   varying partial atmospheric conditions while at least one of the processing devices is in operation at each of the plurality of locations within the clean room.

23. A device production method according to claim 22, further comprising the step of adjusting the cleanness at the plurality of locations in the clean room.

24. A device production method according to claim 22, wherein said measuring step comprises measuring the cleanness of the air at the plurality of locations in the clean room and further comprising the step of independently controlling blowers disposed adjacent to a wall of the clean room to condition the air at the plurality of locations.

25. A device production method according to claim 22, further comprising the step of adjusting the temperature at the plurality of locations in the clean room.

26. A device production method according to claim 22, wherein said measuring step comprises measuring the temperature at the plurality of locations in the clean room and further comprising independently controlling cooling devices disposed adjacent to a wall of the clean room to adjust the temperature of the air at the plurality of locations.

27. A device production method according to claim 22, further comprising the step of controlling the ambient atmosphere adjacent each of the processing devices in the clean room independently of the atmosphere in the clean room.

28. A device production method according to claim 22, further comprising the steps of conveying a substrate from one processing device to another and incrementally adjusting the atmospheric conditions along the conveyance path of the substrate.

* * * * *

UNITED STATES PATENT AND TRADEMARK OFFICE
CERTIFICATE OF CORRECTION

PATENT NO. : 5,828,572

DATED : October 27, 1998

INVENTOR(S) : TAKAYUKI HASEGAWA, ET AL.

It is certified that error appears in the above-identified patent and that said Letters Patent is hereby corrected as shown below:

COLUMN 1:

Line 34, "of)" should read --of the)--.

COLUMN 2:

Line 42, "beam" should read --beam,--.

COLUMN 3:

Line 18, "as" should read --as for--.

Signed and Sealed this

Eighteenth Day of May, 1999

Attest:

Q. TODD DICKINSON

*Attesting Officer*  Acting Commissioner of Patents and Trademarks